(12) United States Patent
Lin et al.

(10) Patent No.: US 9,917,085 B2
(45) Date of Patent: Mar. 13, 2018

(54) METAL GATE ISOLATION STRUCTURE AND METHOD FORMING SAME

(71) Applicant: Taiwan Semiconductor Manufacturing Company, Ltd., Hsin-Chu (TW)

(72) Inventors: Chih-Han Lin, Hsin-Chu (TW); Wen-Shuo Hsieh, Taipei (TW); Ming-Jie Huang, Hsin-Chu (TW); Ryan Chia-Jen Chen, Chiayi (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/225,304

(22) Filed: Aug. 1, 2016

(65) Prior Publication Data

US 2017/0345820 A1 Nov. 30, 2017

(51) Int. Cl.
*H01L 27/092* (2006.01)
*H01L 29/78* (2006.01)
*H01L 27/088* (2006.01)
*H01L 21/782* (2006.01)
*H01L 29/66* (2006.01)
(Continued)

(52) U.S. Cl.
CPC .. *H01L 27/0886* (2013.01); *H01L 21/823431* (2013.01); *H01L 21/823437* (2013.01); *H01L 21/823468* (2013.01); *H01L 21/823807* (2013.01); *H01L 21/823878* (2013.01); *H01L 27/0924* (2013.01); *H01L 27/1104* (2013.01); *H01L 29/0649* (2013.01); *H01L 29/66545* (2013.01); *H01L 29/66818* (2013.01); *H01L 29/7848* (2013.01); *H01L 29/7851* (2013.01)

(58) Field of Classification Search
CPC ............. H01L 27/0886; H01L 27/0924; H01L 27/1104; H01L 29/0649; H01L 29/7848; H01L 29/7851; H01L 29/66545; H01L 29/66818; H01L 21/823468; H01L 21/823431; H01L 21/823437; H01L 21/823807; H01L 21/823878
USPC ............... 257/401, 330, 347, 365, 369, 392; 438/198, 218, 275, 283, 466
See application file for complete search history.

(56) References Cited

U.S. PATENT DOCUMENTS 7,667,271 B2 2/2010 Yu et al.
7,910,453 B2 3/2011 Xu et al.
(Continued)

FOREIGN PATENT DOCUMENTS

| TW | 201517272 A | 5/2015 |
| TW | 201608716 A | 3/2016 |
| TW | 201614844 A | 4/2016 |

*Primary Examiner* — Dao H Nguyen
(74) *Attorney, Agent, or Firm* — Slater Matsil, LLP

(57) ABSTRACT

A device includes a gate isolation plug, which further includes a U-shaped layer having a bottom portion and two sidewall portions, and an inner region overlapping the bottom portion. The inner region contacts the two sidewall portions. A first transistor has a first gate stack, and a first end of the first gate stack is in contact with both the inner region and the U-shaped layer of the gate isolation plug. A second transistor has a second gate stack, and a second end of the second gate stack is in contact with both the inner region and the U-shaped layer of the gate isolation plug. The first gate stack and the second gate stack are on opposite sides of the gate isolation plug.

20 Claims, 19 Drawing Sheets

(51) Int. Cl.
*H01L 21/8234* (2006.01)
*H01L 29/06* (2006.01)
*H01L 27/11* (2006.01)
*H01L 21/8238* (2006.01)

(56) References Cited

U.S. PATENT DOCUMENTS

| | | | |
|---|---|---|---|
| 8,377,779 B1 | 2/2013 | Wang | |
| 8,399,931 B2 | 3/2013 | Liaw et al. | |
| 8,652,894 B2 | 2/2014 | Lin et al. | |
| 8,686,516 B2 | 4/2014 | Chen et al. | |
| 8,716,765 B2 | 5/2014 | Wu et al. | |
| 8,723,272 B2 | 5/2014 | Liu et al. | |
| 8,729,627 B2 | 5/2014 | Cheng et al. | |
| 8,735,993 B2 | 5/2014 | Lo et al. | |
| 8,736,056 B2 | 5/2014 | Lee et al. | |
| 8,772,109 B2 | 7/2014 | Colinge | |
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,860,148 B2 | 10/2014 | Hu et al. | |
| 9,105,490 B2 | 8/2015 | Wang et al. | |
| 9,601,492 B1 * | 3/2017 | Deng | H01L 27/0924 |
| 2013/0037886 A1 * | 2/2013 | Tsai | H01L 21/823821 257/351 |
| 2014/0001574 A1 | 1/2014 | Chen et al. | |
| 2014/0110755 A1 | 4/2014 | Colinge | |
| 2014/0151812 A1 | 6/2014 | Liaw | |
| 2015/0115363 A1 | 4/2015 | Chang et al. | |
| 2016/0056232 A1 | 2/2016 | Kuo et al. | |
| 2016/0126142 A1 * | 5/2016 | Chen | H01L 29/66 438/283 |
| 2016/0181425 A1 * | 6/2016 | Bai | H01L 29/7848 438/283 |
| 2016/0233094 A1 * | 8/2016 | Anderson | H01L 27/1211 |
| 2017/0040328 A1 * | 2/2017 | Park | H01L 21/823828 |
| 2017/0069725 A1 | 3/2017 | Bhimarasetti et al. | |
| 2017/0110454 A1 * | 4/2017 | Chang | H01L 27/0886 |

* cited by examiner

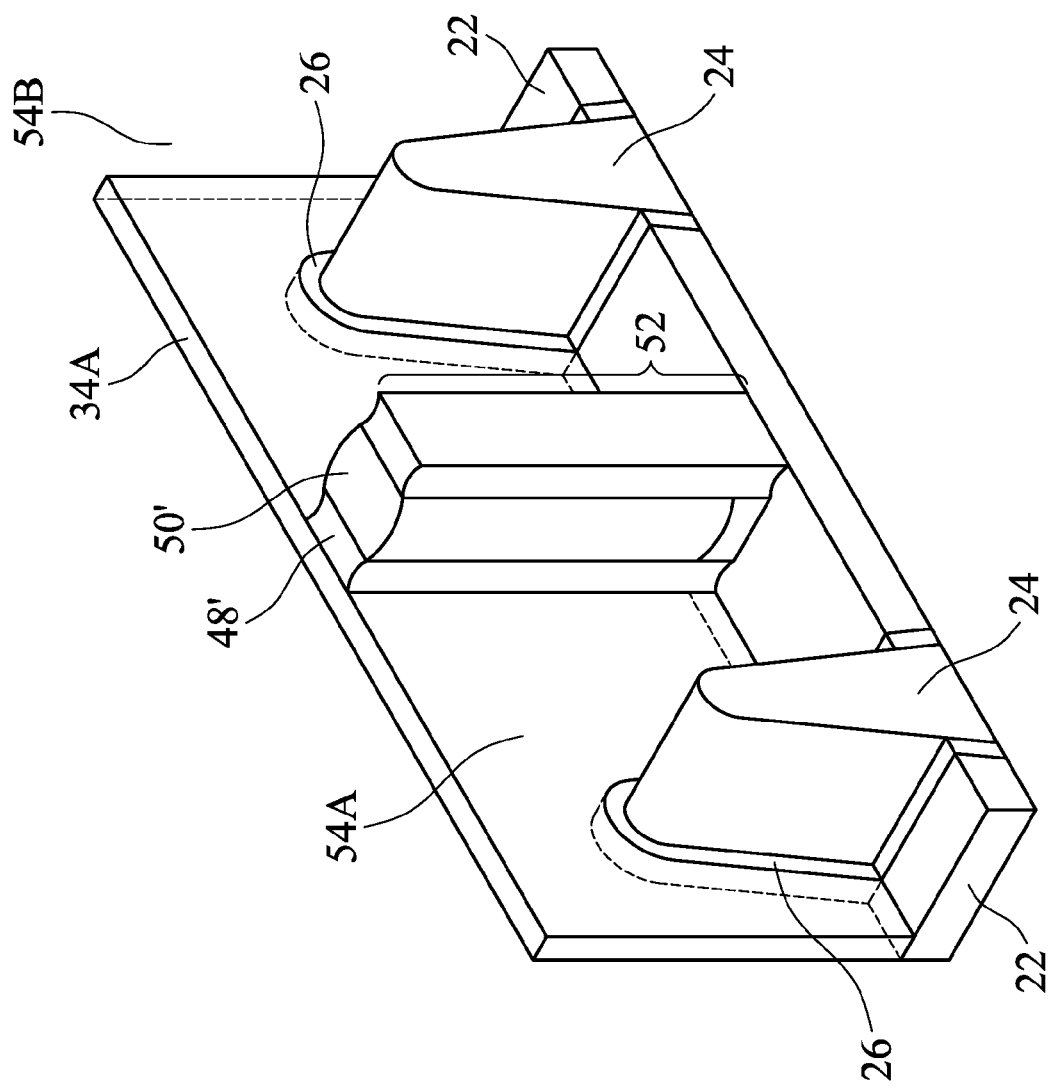

METAL GATE ISOLATION STRUCTURE AND METHOD FORMING SAME

PRIORITY CLAIM AND CROSS-REFERENCE

This application claims the benefit of the following provisionally filed U.S. patent application: Application Ser. No. 62/343,294, filed May 31, 2016, and entitled "Metal Gate Isolation Structure and Method Forming Same;" which application is hereby incorporated herein by reference.

BACKGROUND

Metal-Oxide-Semiconductor (MOS) devices are basic building elements in integrated circuits. An existing MOS device typically has a gate electrode having polysilicon doped with p-type or n-type impurities, using doping operations such as ion implantation or thermal diffusion. The work function of the gate electrode was adjusted to the band-edge of the silicon. For an n-type Metal-Oxide-Semiconductor (NMOS) device, the work function may be adjusted to close to the conduction band of silicon. For a P-type Metal-Oxide-Semiconductor (PMOS) device, the work function may be adjusted to close to the valence band of silicon. Adjusting the work function of the polysilicon gate electrode can be achieved by selecting appropriate impurities.

MOS devices with polysilicon gate electrodes exhibit carrier depletion effect, which is also referred to as a poly depletion effect. The poly depletion effect occurs when the applied electrical fields sweep away carriers from gate regions close to gate dielectrics, forming depletion layers. In an n-doped polysilicon layer, the depletion layer includes ionized non-mobile donor sites, wherein in a p-doped polysilicon layer, the depletion layer includes ionized non-mobile acceptor sites. The depletion effect results in an increase in the effective gate dielectric thickness, making it more difficult for an inversion layer to be created at the surface of the semiconductor.

The poly depletion problem may be solved by forming metal gate electrodes or metal silicide gate electrodes, wherein the metallic gates used in NMOS devices and PMOS devices may also have band-edge work functions. Since the NMOS devices and PMOS devices have different requirements regarding the work functions, dual-gate CMOS devices are used.

In the formation of the metal gate electrodes, a long dummy gate is formed first, which is then etched, so that the portions of the long dummy gate are separated from each other. A dielectric material is then filled into the opening left by the etched portion of the long dummy gate. The dielectric material is then polished, leaving a portion of the dielectric material between the remaining portions of the dummy gate. The separated portions of the dummy gate are then replaced with metal gates.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
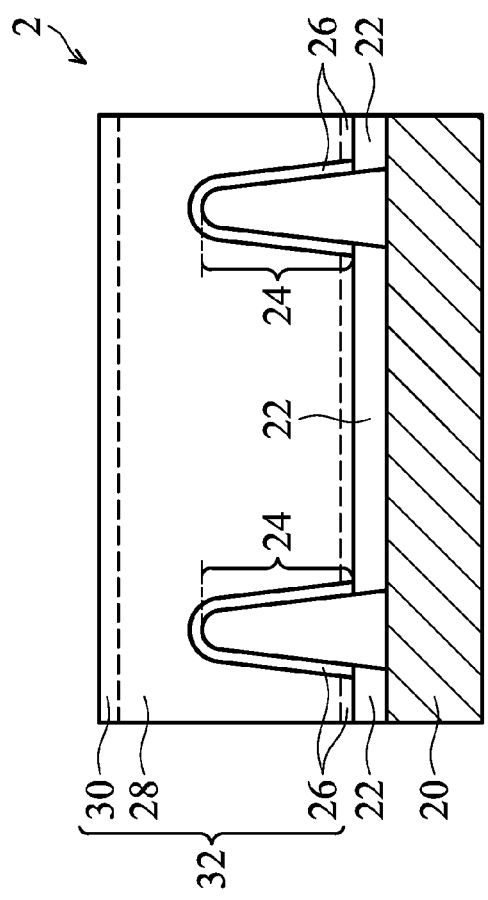
FIGS. 1A through 10B illustrate the cross-sectional views, the top views, and the perspective views of intermediate stages in the formation of Fin Field-Effect Transistors (FinFETs) and a gate isolation plug in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A gate isolation structure and the method of forming the same are provided in accordance with various exemplary embodiments. The intermediate stages of forming the gate isolation structure are illustrated in accordance with some embodiments. Some variations of some embodiments are discussed. Throughout the various views and illustrative embodiments, like reference numbers are used to designate like elements.

Figure 12:
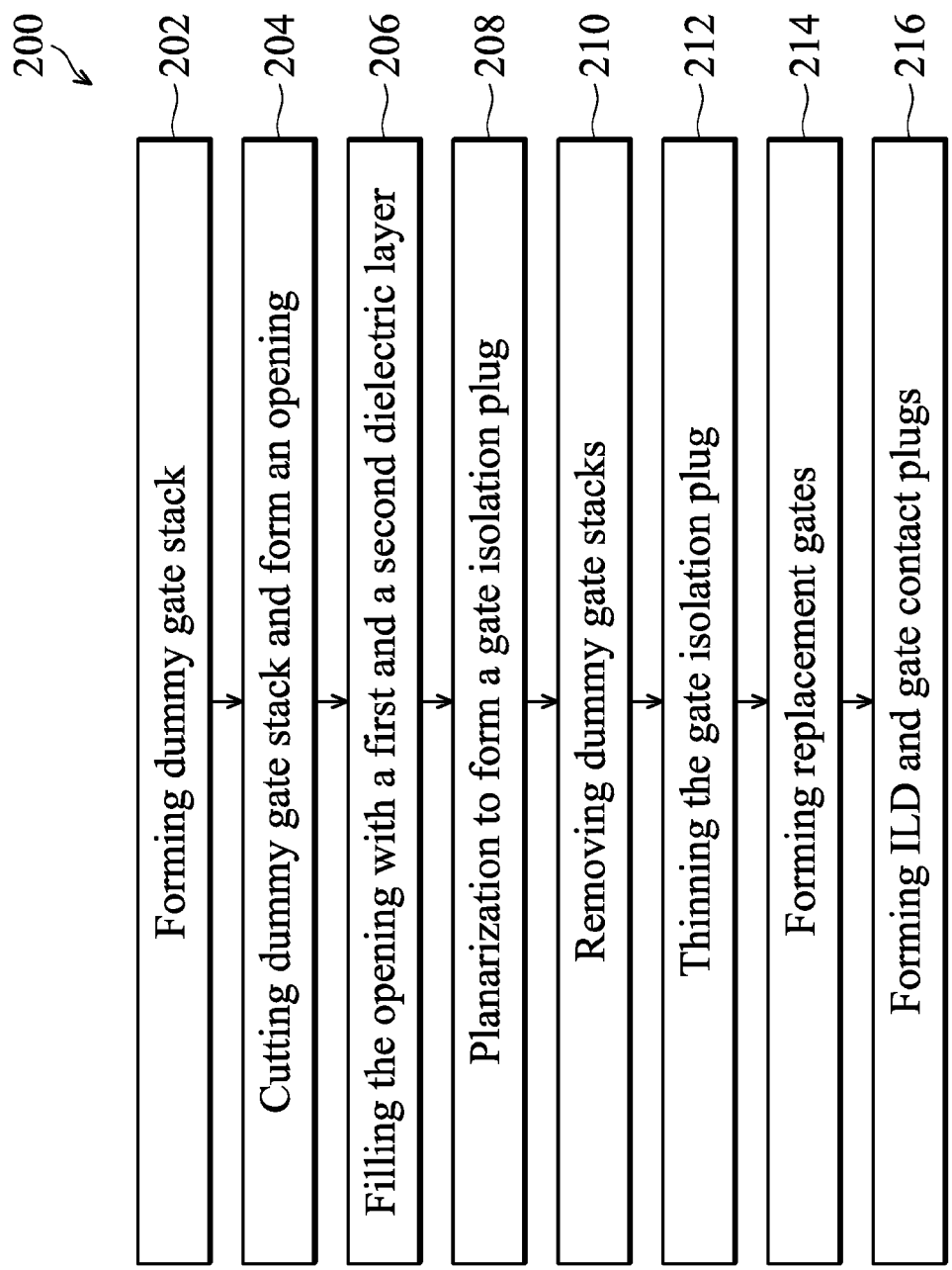
FIG. 12 illustrates a process flow for forming FinFETs and a gate isolation structure in accordance with some embodiments.

FIGS. 1A through 10B illustrate the cross-sectional views, the top views, and the perspective views of intermediate stages in the formation of Fin Field-Effect Transistors and a gate isolation structure in accordance with some embodiments. The steps shown in FIGS. 1A through 10B are also illustrated schematically in the process flow shown in FIG. 12.

FIG. 1A illustrates the initial steps and the resulting structure in accordance with some embodiments. Substrate 20, which is a portion of semiconductor wafer 2, is provided. Substrate 20 may be a semiconductor substrate such as a silicon substrate, and other materials such as silicon germanium, silicon carbon, and the like, may be used. Substrate 20 may also be a bulk semiconductor substrate or a silicon-on-insulator substrate.

Isolation regions 22 are formed to extend into substrate 20. Isolation regions 22 may be, for example, Shallow Trench Isolation (STI) regions. The formation of STI regions 22 may include etching semiconductor substrate 20 to form trenches (not shown), and filling the trenches with a dielectric material to form STI regions 22. STI regions 22 may be formed of silicon oxide, although other dielectric materials such as nitrides may also be used.

Semiconductor fins 24 protrude out of the top surfaces of STI region 22, and overlap the underlying semiconductor strips, which are portions of semiconductor substrate 20 between STI regions 22. The formation of semiconductor fins 24 may include forming STI regions 22 to have top surfaces level with the top surfaces of semiconductor fins 24, and recessing STI regions 22. The portions of semiconductor material between the removed portions of STI regions 22 thus become semiconductor fins 24. Semiconductor fins 24 and some or substantially entireties of semiconductor strips may be formed of silicon or other silicon-containing compounds including, and not limited to, silicon carbon, silicon germanium, or the like.

Dummy gate stack 32 is formed over STI regions 22 and semiconductor fins 24. The respective step is illustrated as step 202 in the process flow shown in FIG. 12. Dummy gate stack 32 includes gate dielectric 26 and dummy gate electrode 28 over gate dielectric 26. The portions of gate dielectric 26 underlying gate dummy gate electrode 28 may be removed in later steps, and hence gate dielectric 26 is a dummy gate dielectric in accordance with these embodiments. The portions of gate dielectric 26 underlying gate dummy gate electrode 28 may also be left in the final device in accordance with some embodiments, and hence gate dielectric 26 act as the gate dielectrics of the resulting FinFETs. In accordance with some embodiments of the present disclosure, gate dielectric 26 includes silicon oxide. In accordance with alternative embodiments, other materials such as silicon nitride, silicon carbide, or the like, can also be used to form gate dielectric 26. Gate dielectric 26 may be formed by oxidizing semiconductor fins 24, and hence gate dielectric 26 is formed conformally on semiconductor fins 24, as shown in FIG. 1A. In accordance with alternative embodiments, gate dielectric 26 is formed through deposition, and hence will include horizontal portions on the top surfaces of STI regions 22 in addition to the illustrated portions. The respective horizontal portions of gate dielectric 26 are illustrated using dashed lines.

Dummy gate electrode 28 may include polysilicon. In accordance with some embodiments, dummy gate stack 32 further includes hard mask 30 over dummy gate electrode 28. Hard mask 30 may be formed of silicon nitride, for example, while other materials such as silicon carbide, silicon oxynitride, or the like may also be used. In accordance with alternative embodiments, hard mask 30 is not formed. Accordingly, hard mask 30 is illustrated in FIG. 1A using a dashed line to indicate it may or may not be formed. In subsequent figures, hard mask 30 is not illustrated, while it may or may not exist.

Figure 1B:
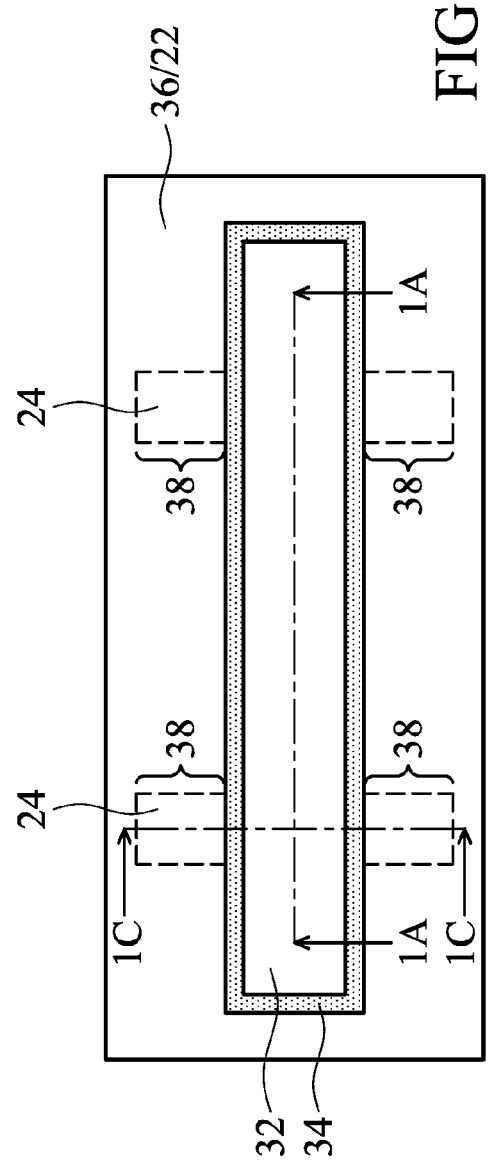

As shown in FIG. 1A, dummy gate stack 32 crosses over a plurality of semiconductor fins 24. FIG. 1B illustrates a top view of dummy gate stack 32 in accordance with some embodiments, wherein the cross-sectional view shown in FIG. 1A is obtained from the plane containing line 1A-1A in FIG. 1B. It is appreciated that although FIGS. 1A and 1B illustrate that dummy gate stack 32 crosses over two semiconductor fins 24 for the simplicity of illustration, dummy gate stack 32 may cross over (and extends on the sidewalls of) three, four, or any greater number of semiconductor fins.

Referring to FIG. 1B, gate spacer 34 is formed on the sidewalls of dummy gate stack 32. Gate spacer 34 may form a ring encircling dummy gate stack 32. Gate spacer 34 may be formed of oxides, nitrides, oxynitrides, carbides, or the like. In accordance with some exemplary embodiments, gate spacer 34 includes a silicon oxide layer and a silicon nitride layer over the silicon oxide layer, wherein the silicon oxide layer may have an L-shape in a cross-sectional view, with the silicon nitride layer on the horizontal leg of the silicon nitride layer.

Figure 1C:
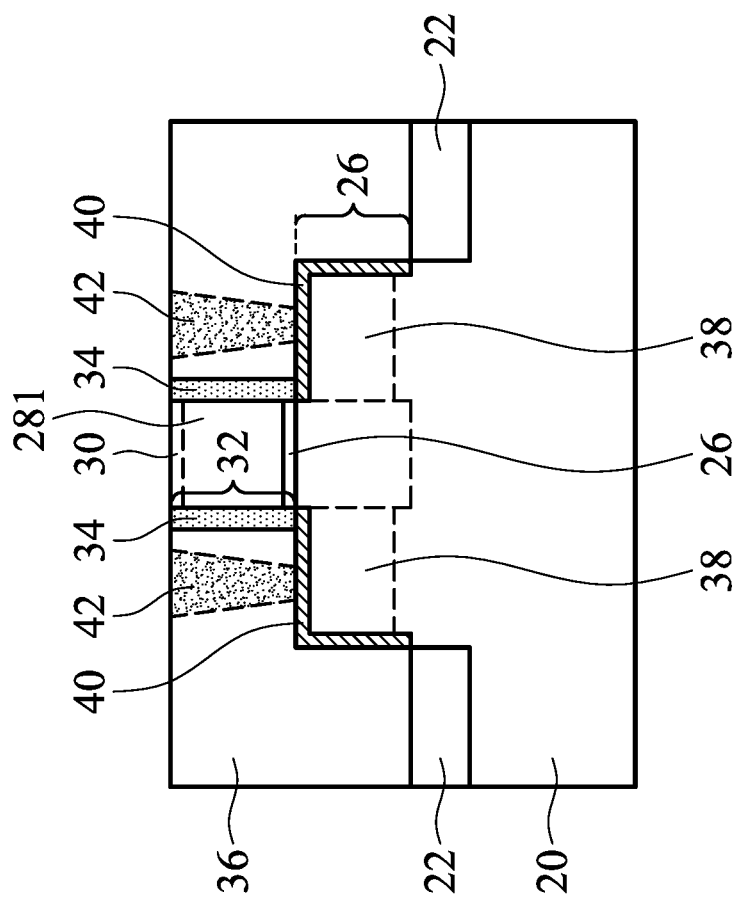

Further referring to FIG. 1B, Inter-Layer Dielectric (ILD) 36 surrounds. FIG. 1C illustrates a cross-sectional view of the structure shown in FIG. 1B, wherein the cross-sectional view is obtained from the plane containing line 1C-1C in FIG. 1B. The top surface of ILD 36 is coplanar with the top surface of dummy gate stack 32 and the top surface of gate spacer 34. ILD 36 may be blanket formed to a height higher than the top surface of dummy gate stack 32, followed by a planarization (such as a Chemical Mechanical Polish (CMP)) to remove excess portions of ILD 36, wherein the excess portions are higher than the top surfaces of dummy gate stack 32 and gate spacer 34. ILD 36 may comprise a Flowable oxide formed using, for example, Flowable Chemical Vapor Deposition (FCVD). ILD 36 may also be a spin-on glass formed using spin-on coating. ILD 36 may also be formed of Phospho-Silicate Glass (PSG), Boro-Silicate Glass (BSG), Boron-Doped Phospho-Silicate Glass (BPSG), Tetraethyl Orthosilicate (TEOS) oxide, TiN, SiOC, or another low-k non-porous dielectric material.

In accordance with some embodiments, as shown in FIG. 1C, source and drain regions (referred to as source/drain regions hereinafter) 38 are formed in the opposite end portions of semiconductor fins 24 not covered by dummy gate stack 32. Source/drain regions 38 may be formed by implanting the end portions of semiconductor fins 24, or by recessing the end portions of semiconductor fins 24 to form recesses, followed by re-growing source/drain regions in the recesses. Source/drain silicide regions 40 may be formed on the surfaces of source/drain regions 38. Source/drain contact plugs 42 may be formed to extend into ILD 36 in order to electrically connect to source/drain regions 38. Source/drain contact plugs 42 may be formed of tungsten or other conductive materials/metals. In accordance with alternative embodiments, source/drain silicide regions 40 and contact plugs 42, rather than being formed at this stage, are formed in later stages, for example, after the formation of ILD 68 as shown in FIG. 10B. Similarly, source/drain contact plugs 42 may also be formed either in the initial steps or in later stages, and hence source/drain contact plugs 42 are shown using dashed lines.

Figure 2A:
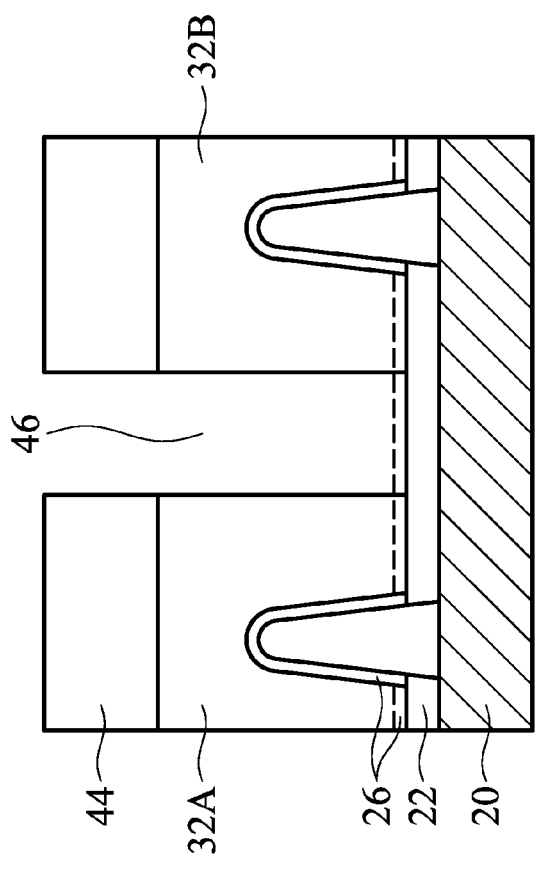
Figure 2B:
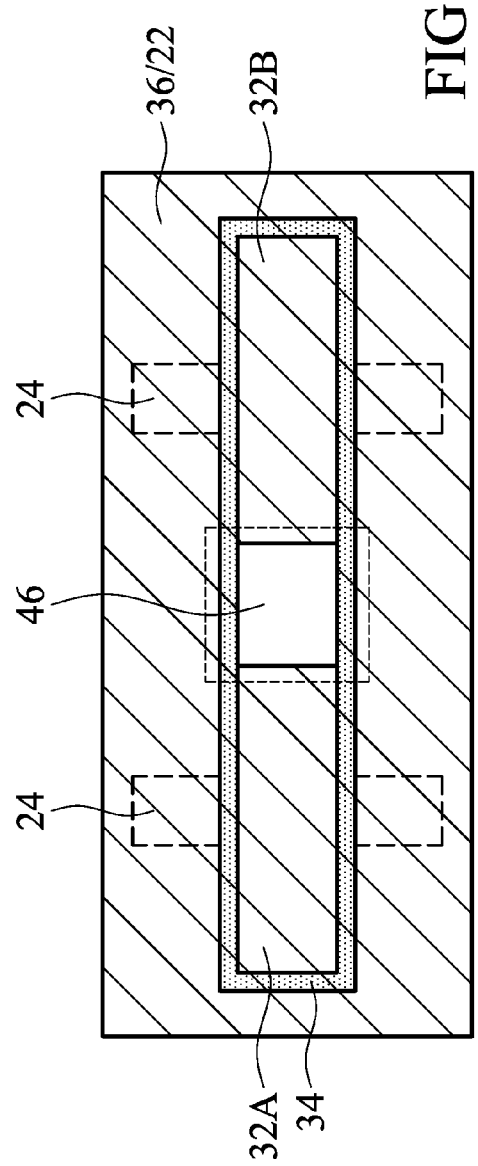

Referring to FIG. 2A, photo resist 44 is formed and patterned. FIG. 2B illustrates a top view of the structure shown in FIG. 2A. As shown in FIG. 2B, photo resist 44 covers the end portions of dummy gate stack 32, while leaving a center portion of dummy gate stack 32 not covered. Dummy gate stack 32 is then etched through the opening in photo resist 44. The respective step is illustrated as step 204 in the process flow shown in FIG. 12. As a result, as shown in FIGS. 2A and 2B, a center portion of dummy gate stack 32 is removed. The long dummy gate stack 32 is thus cut into two discrete portions that are disconnected from each other in accordance with some exemplary embodiments. The remaining portions are referred to as dummy gate stacks 32A and 32B. In the embodiments wherein dummy gate stack 32 in FIG. 1B crosses over three, four, or more semiconductor fins 24, dummy gate stack 32 may be cut into three, four, or more discrete portions. Furthermore, each discrete portion of dummy date stack 32 may cross over one, two, or more semiconductor fins 24 in order to form single-fin FinFETs or multi-fin FinFETs. After the etching of dummy gate stack 32, photo resist 44 is removed, for example, in an ashing process.

As a result of the etching of dummy gate stack 32, opening 46 is formed between dummy gate stacks 32A and 32B. Furthermore, opening 46 is formed between gate spacer portions 34A and 34B, which are the parallel opposite portions of gate spacer 34. Each of gate spacer portions 34A and 34B has a sidewall exposed to opening 46. As shown in FIG. 2A, when dummy gate dielectric 26 has the horizontal portion as shown by dashed line, the exposed horizontal portion may be exposed to opening 46. Furthermore, the exposed horizontal portion of gate dielectric 26 may be removed during the etching of dummy gate stack 32, or may remain (and thinned) during the etching of dummy gate stack 32.

Figure 3:
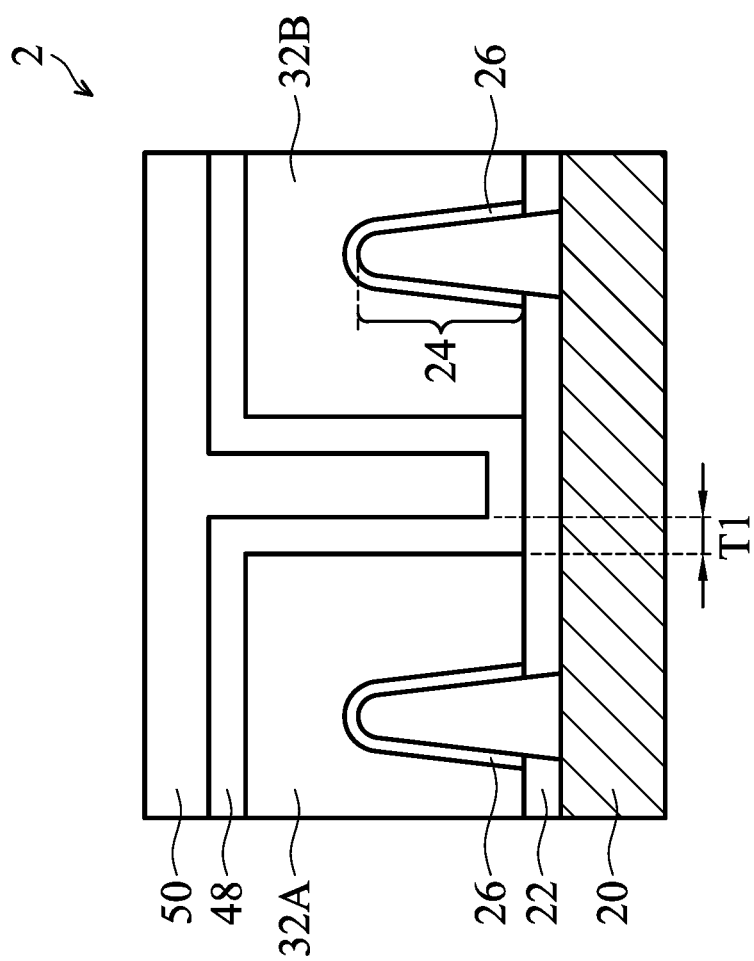

Next, opening 46 is filled by dielectric layers/regions 48 and 50, as shown in FIG. 3. The respective step is illustrated as step 206 in the process flow shown in FIG. 12. Dielectric layers 48 and 50 are formed of different dielectric materials, which are selected from the same group of dielectric materials including, and not limited to, oxide-based dielectric materials, nitride-based dielectric materials, oxynitride-based dielectric materials, oxycaride-based dielectric materials, carbide-based dielectric materials, etc. In accordance with some exemplary embodiments, dielectric layer 48 is formed of an oxide such as silicon oxide, and dielectric layer 50 is formed of a nitride such as silicon nitride. In addition, dielectric layer 48 is formed of a material different from the material of gate spacer 34. In the embodiments in which gate spacer 34 has a multi-layer structure, dielectric layer 48 is formed of a material different from the material of the portions of gate spacer 34 that have their sidewalls in physical contact with dielectric layer 48.

In accordance with some embodiments, dielectric layer 48 is formed using a conformal deposition method, and hence the thickness of its vertical portions is close to the thickness of its horizontal portions. In accordance with some exemplary embodiments, dielectric layer 48 is formed using Atomic Layer Deposition (ALD), Low-Pressure Chemical Vapor Deposition (LPCVD), or other applicable deposition methods. Thickness T1 of dielectric layer 48 may be in the range between about 1 nm and about 5 nm in accordance with some exemplary embodiments. Dielectric layer/region 50 fills the remaining space of opening 46 (FIG. 2A) unfilled by dielectric layer 48. The formation of dielectric layer 48 may include ALD, Chemical Vapor Deposition (CVD), or other deposition methods, as long as the remaining opening 46 is fully filled. Dielectric layers 48 and 50 have portions higher than the top surfaces of dummy gate stacks 32A and 32B.

Figure 4A:
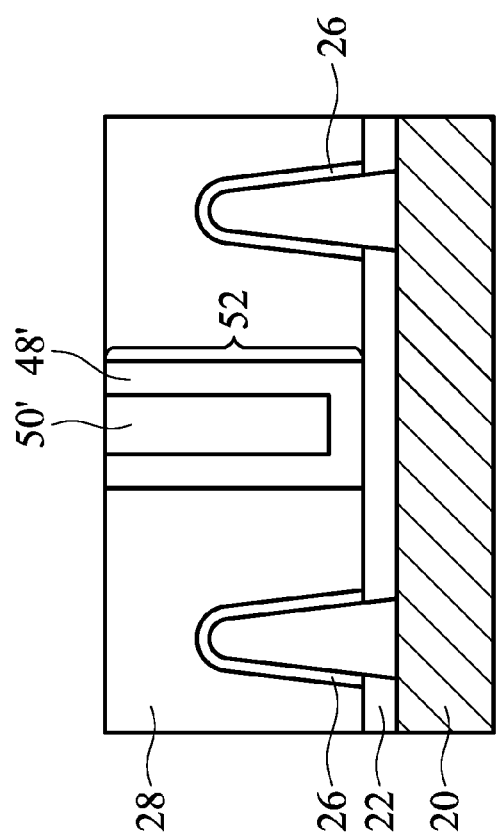
Figure 4B:
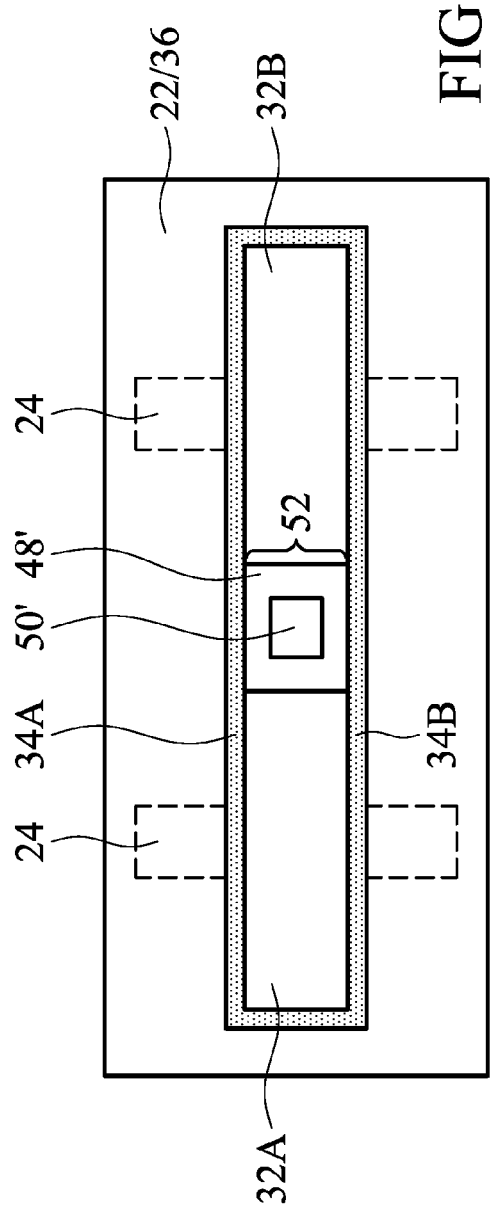

Referring to FIGS. 4A and 4B, a planarization process is performed on wafer 2 as shown in FIG. 3 to remove excess portions of dielectric layers 48 and 50. The respective step is illustrated as step 208 in the process flow shown in FIG. 12. The portions of dielectric layers 48 and 50 higher than the top surfaces of dummy gate stacks 32A and 32B are removed. As a result, dummy gate stacks 32A and 32B are exposed. In the meantime, ILD 36 (not shown in FIG. 4A, refer to FIG. 1C) is also exposed in accordance with some embodiments. The remaining portions of dielectric layers 48 and 50 are in combination referred to as gate isolation plug 52 hereinafter, which includes remaining dielectric layer 48' and remaining inner dielectric region 50' over the bottom portion of dielectric layer 48'.

FIG. 4B illustrates a top view of the structure shown in FIG. 4A. As shown in FIG. 4B, gate isolation plug 52 separates dummy gate stacks 32A and 32B from each other. Gate isolation plug 52 and dummy gate stacks 32A and 32B in combination forms a strip in the top view, and the strip is between opposite portions 34A and 34B of gate spacer 34.

Figure 5A:
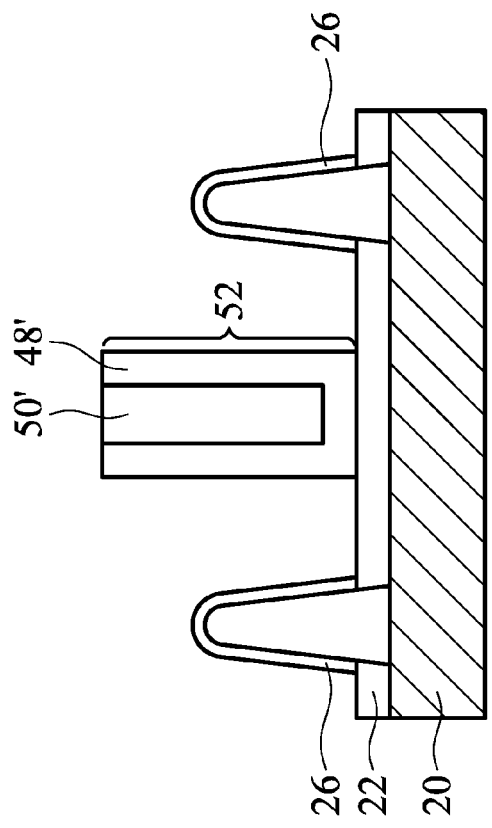
Figure 5B:
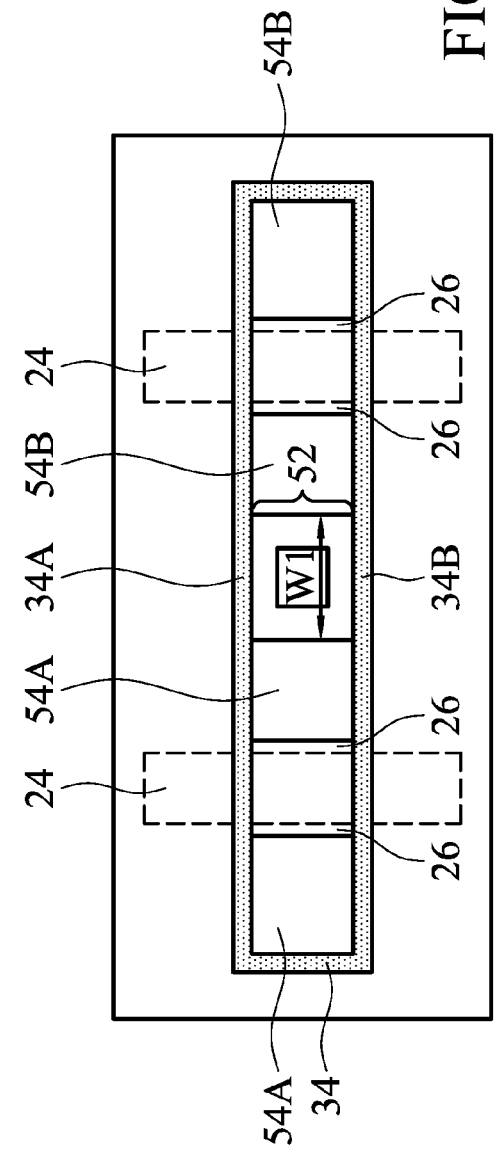

Dummy gate stacks 32A and 32 are then etched. Dummy gate electrodes 28 and hard mask 30 (FIG. 4A), if any, are removed in the etch. The respective step is illustrated as step 210 in the process flow shown in FIG. 12. In accordance with some embodiments of the present disclosure, gate dielectric 26 is not removed, and hence is exposed after the removal of dummy gate electrodes 28. The resulting structure is shown in FIGS. 5A and 5B, which illustrate a cross-sectional view and a top view, respectively. In accordance with alternative embodiments, gate dielectric 26 is removed, and hence semiconductor fins 24 are exposed. Openings 54A and 54B are formed in the space left by the removed dummy gate electrodes 28 (and possibly gate dielectrics 26). As shown in FIG. 5B, each of openings 54A and 54B is defined by gate isolation plug 52 and gate spacer 34, and openings 54A and 54B are further separated from each other by gate isolation plug 52. The width of gate isolation plug 52 is shown as W1.

Figure 5C:
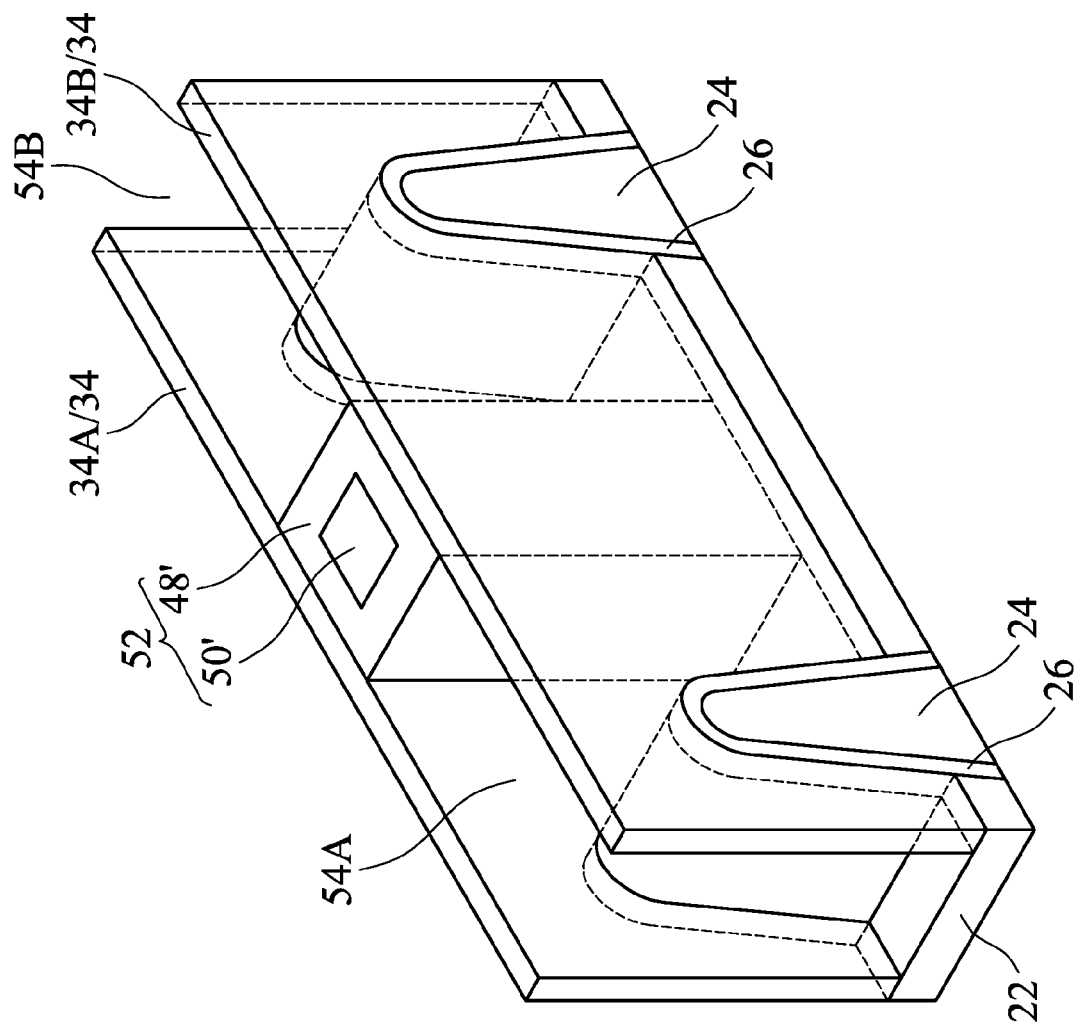

FIG. 5C illustrates a perspective view of the structure shown in FIGS. 5A and 5B in accordance with some embodiments. Gate spacer 34 is illustrated as being transparent in order to show the structure hidden behind gate spacer 34. In reality, gate spacer 34 may be transparent or opaque, depending on the material and the thickness of gate spacer 34. The end portions of gate spacer 34, source/drain regions, and ILD 36 are not shown in FIG. 5C. As shown in FIG. 5C, gate isolation plug 52 includes a basin formed of dielectric layer 48', and inner dielectric region 50' in the basin.

Figure 6A:
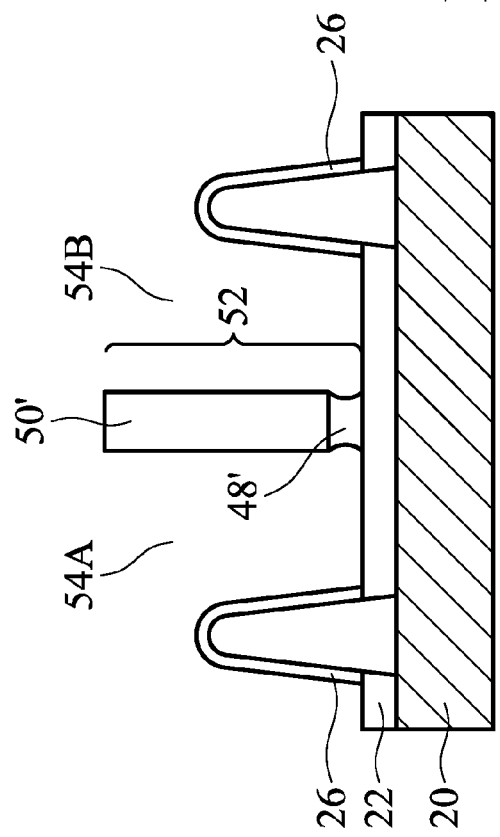
Figure 6B:
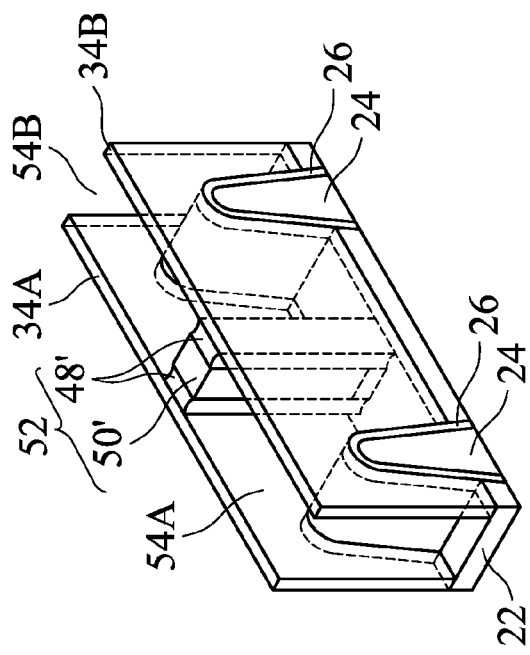

Next, the sidewall portions of dielectric layer 48' exposed to openings 54A and 54B are removed in an etching step. The respective step is illustrated as step 212 in the process flow shown in FIG. 12. The resulting structure is shown in FIGS. 6A and 6B, which illustrate a cross-sectional view and a perspective view, respectively. The etching is performed using an etching gas or an etching solution that attacks dielectric layer 48', and substantially does not attack dielectric region 50' and gate spacer 34. As a result, the sidewall portions of dielectric layer 48' exposed to openings 54A and 54B are removed, while the sidewall portions of dielectric layer 48' in contact with gate spacer portions 34A and 34B remain after the etching. The etching may be isotropic, which may be dry etch or wet etch in accordance with some embodiments. The resulting gate dielectric layer 48' is a U-shaped layer including a bottom portion and two sidewall portions having bottom ends connected to the bottom portions. Dielectric region 50' is located on the bottom portion of dielectric layer 48'.

Figure 6C:
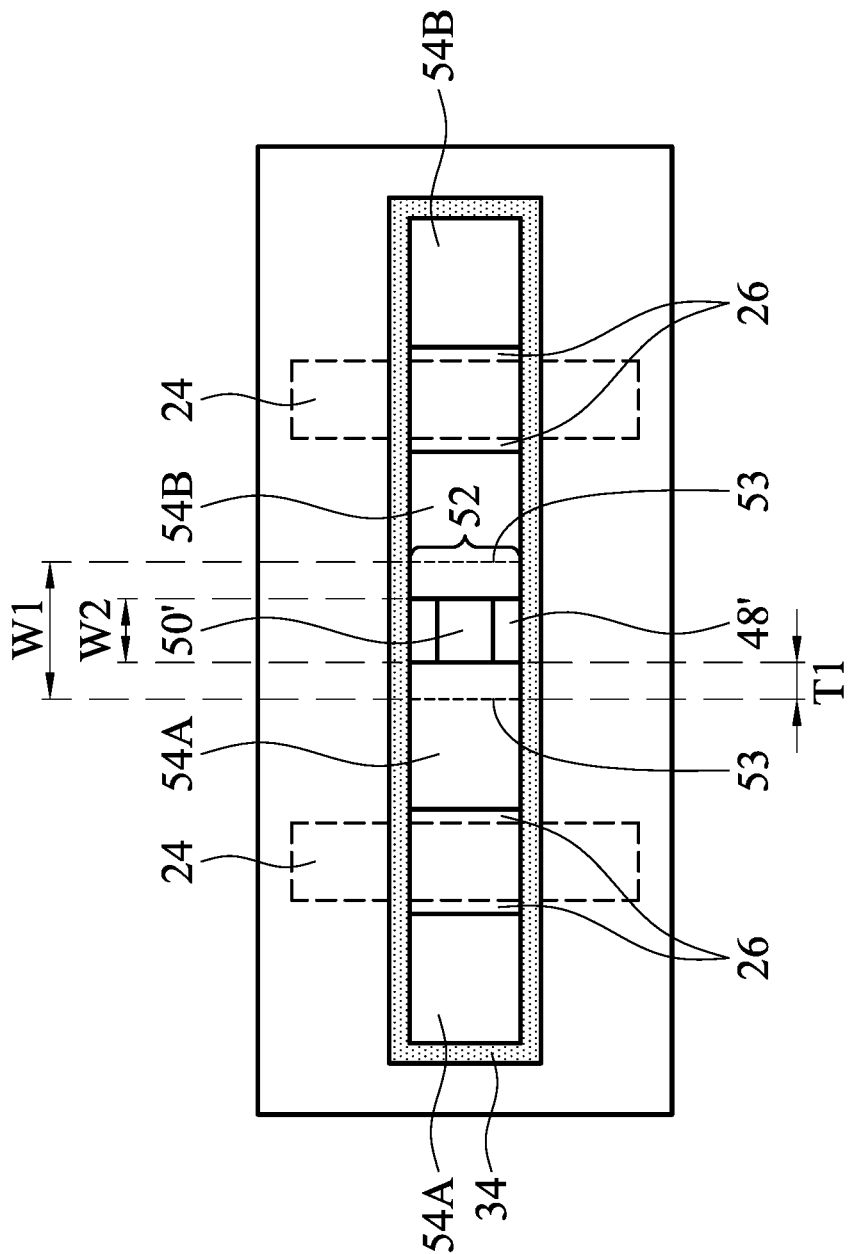

FIG. 6C illustrates a top view of the structure shown in FIGS. 6A and 6B. FIG. 6C, for comparison purpose, also uses dashed lines to illustrate the removed sidewall portions of dielectric layer 48'. It is shown that through the etching, the width of gate isolation plug 52 is reduced from W1 to W2, wherein W2 may be equal to, or slightly smaller than, (W1-2T1). Accordingly, the etching step as shown in FIGS. 6A, 6B, and 6C is also referred to as the thinning of gate isolation plug 52. Hence, by forming the basin-shaped dielectric layer 48', and then etching two sidewall portions of dielectric layer 48', the width of gate isolation plug 52 is reduced. It is realized that when the size of gate isolation plug 52 is very small, for example, reaching the limit of lithography process, it is difficult to further reduce the size of gate isolation plug 52. Advantageously, the embodiments of the present disclosure provide a gate isolation plug that has a reduced size. The width W2 may be smaller than the smallest size achievable by lithography processes.

In the etching of the sidewall portions of dielectric layer 48', the sidewall portions of dielectric layer 48' may be recessed laterally, and hence forming curved sidewalls as shown in FIG. 6D. In addition, the sidewalls of dielectric region 50' may also be curved, with the center portions of the sidewalls of dielectric region 50' facing openings 54A and 54B as being protruding beyond the remaining portions.

In addition, during the etching of dummy gate stacks 32A and 32B (FIG. 4A), gate dielectrics 26 may be fully removed, and semiconductor fins 24 are exposed. The resulting structure is also shown in FIG. 6D. Accordingly, the removal of dummy gate dielectric 26 may be integrated with the thinning of gate isolation plug 52 as the same etching step. In FIG. 6D, only gate spacer portion 34A is illustrated, while gate spacer portion 34B (FIG. 6B) is not shown, although it still exists. In accordance with alternative embodiments, in the thinning of gate isolation plug 52, gate dielectric 26 is thinned, with the top portion removed, and the bottom portion remaining on semiconductor fins 24, as shown in FIG. 6B.

Figure 7A:
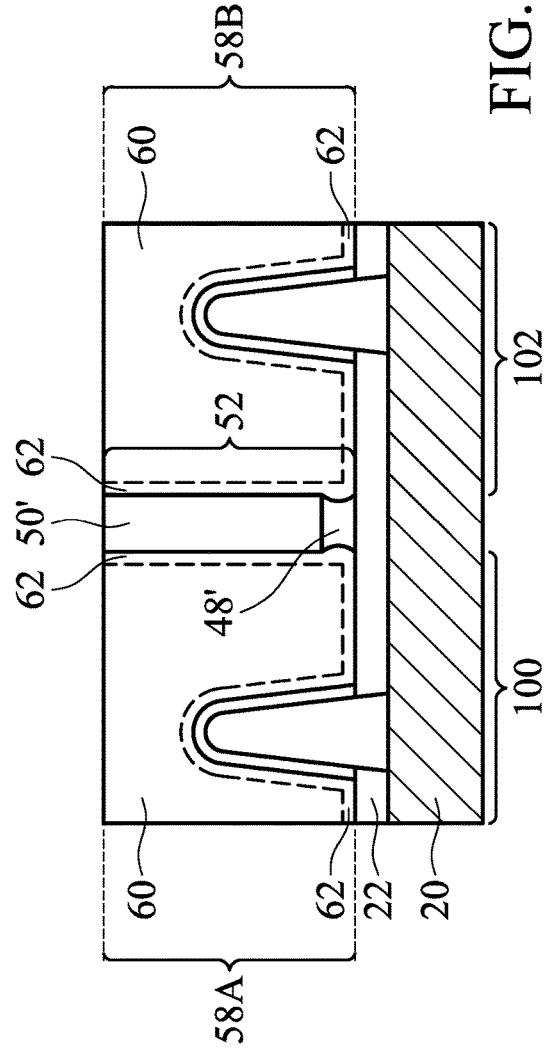
Figure 7B:
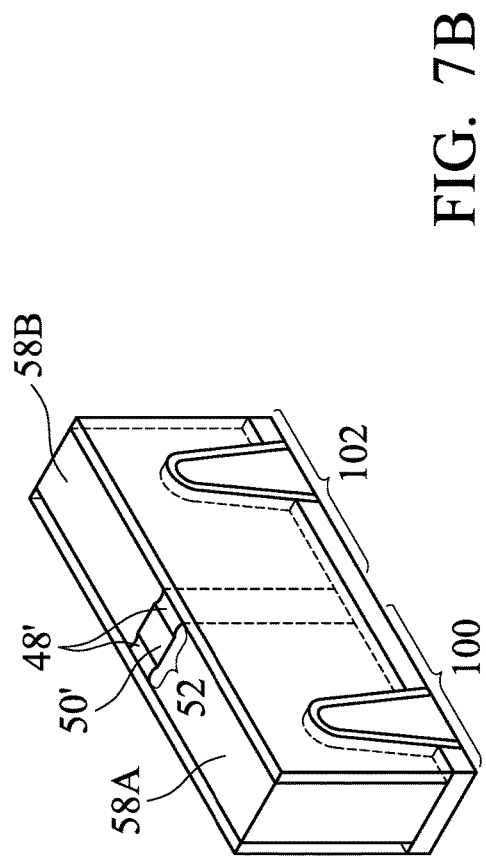
Figure 7C:
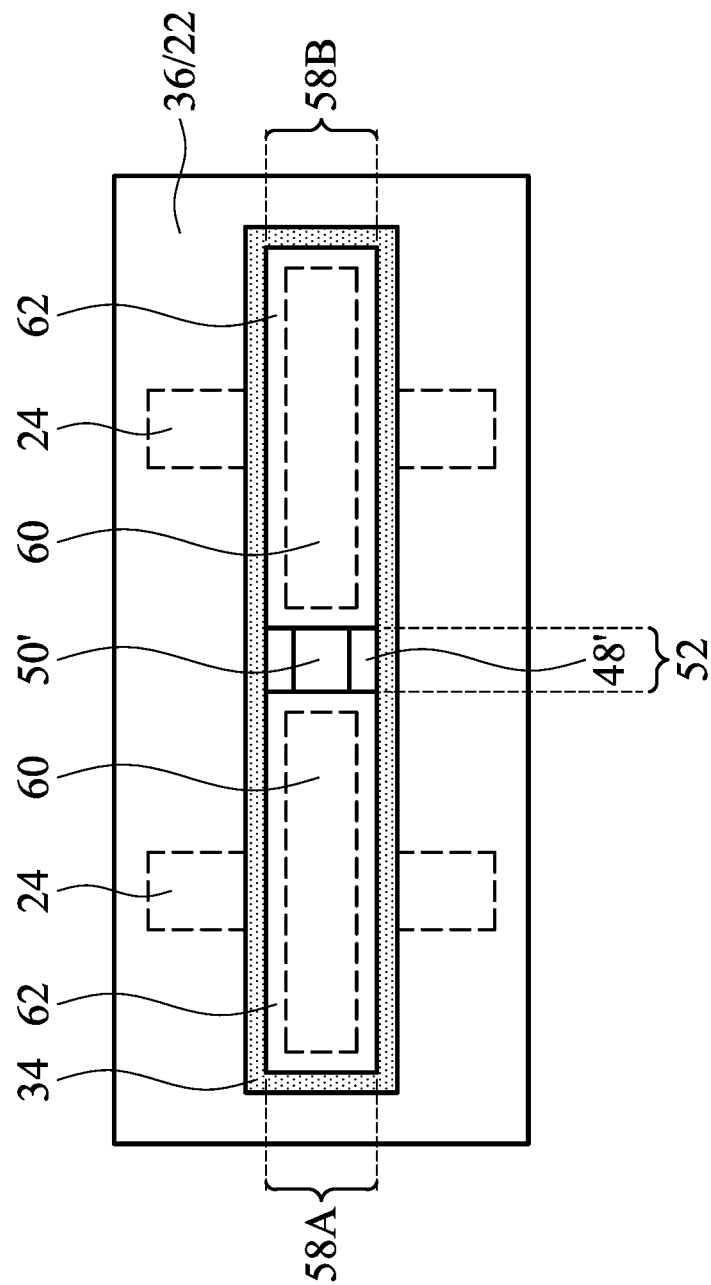

FIGS. 7A, 7B, and 7C illustrate a cross-sectional view, a perspective view, and a top view, respectively, of the formation of replacement gate stacks 58A and 58B. The respective step is illustrated as step 214 in the process flow shown in FIG. 12. Replacement gate stacks 58A and 58B include gate electrodes 60. In accordance with some embodiments of the present disclosure, gate electrodes 60 are formed of a metal, a metal alloy, a metal silicide, a metal nitride, or the like, and may have a composite structure including a plurality of layers formed of TiN, TiAl, Co, Al, and/or the like. The respective metals and the structure are selected so that the resulting replacement gate electrodes 60 have appropriate work functions. For example, when the resulting FinFET is an n-type FinFET, the work function of gate electrode 60 is lower than 4.5 eV, and when the resulting FinFET is a p-type FinFET, the work function of gate electrode 60 is higher than 4.5 eV.

In accordance with some embodiments, replacement gate stacks 58A and 58B further include gate dielectrics 62 (FIGS. 7A and 7C), which may be in physical contact with semiconductor fins 24, or may be in contact with remaining gate dielectric 26. In accordance with alternative embodiments in which gate dielectric 26 remains, no additional gate dielectric is formed, and gate electrodes 60 may be in physical contact with gate dielectric 26 and gate isolation plug 52. Gate dielectrics 62 may include a high-k dielectric material such as hafnium oxide, zirconium oxide, lanthanum oxide, or the like, and may also include a silicon oxide layer as an interfacial layer between the high-k dielectric material and semiconductor fins 24.

As shown in FIG. 7A, the bottom portion of dielectric layer 48' has a curved sidewall, with the curved sidewall has a top portion, a bottom portion, and a middle portion recessed more than the bottom portion and the bottom portion.

FIG. 7C illustrates a top view of replacement gate stacks 58A and 58B. Gate isolation plug 52 separates replacement gate stacks 58A and 58B from each other. Replacement gate stacks 58A and 58B in combination may be viewed as an elongated gate stack strip separated into portions 58A and 58B by gate isolation plug 52. Gate isolation plug 52 and replacement gate stacks 58A and 58B in combination forms a strip having a uniform width in the top view, and the strip is between opposite portions 34A and 34B of gate spacer 34. Alternatively stated, each of continuous (which may be straight) gate spacer portions 34A and/or 34B is in contact with the sidewalls of replacement gate stack 58A, gate isolation plug 52, and replacement gate stack 58B. Gate dielectrics 62 are shown using dashed lines to indicate that they may be, or may not be, formed.

In the resulting structure, FinFETs 100 and 102 are formed, which have replacement gates 58A and 58B, respectively. Replacement gates 58A and 58B share common gate spacers 34A and 34B. Furthermore, both replacement gates 58A and 58B abut the gate isolation plug 52.

Figure 8:
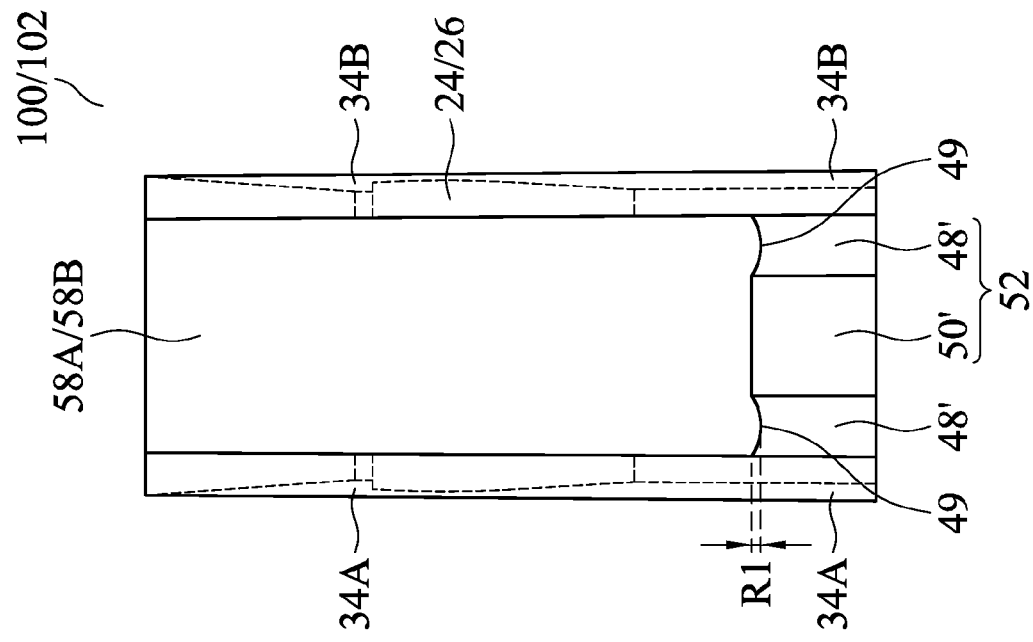

FIG. 8 illustrates a top view of a portion of FinFET 100 or 102 (illustrated as 100/102) in accordance with some embodiments. It is appreciated that dielectric layer 48' may have curved sidewalls 49, which are caused by the thinning of gate isolation plug 52. Curved sidewalls 49 have center portions recessed more than the respective end portions, and the recessing distance R1 may be greater than about 5 Å. Recessing distance R1 may also be in the range between about 5 Å and about 5 nm.

Figure 9A:
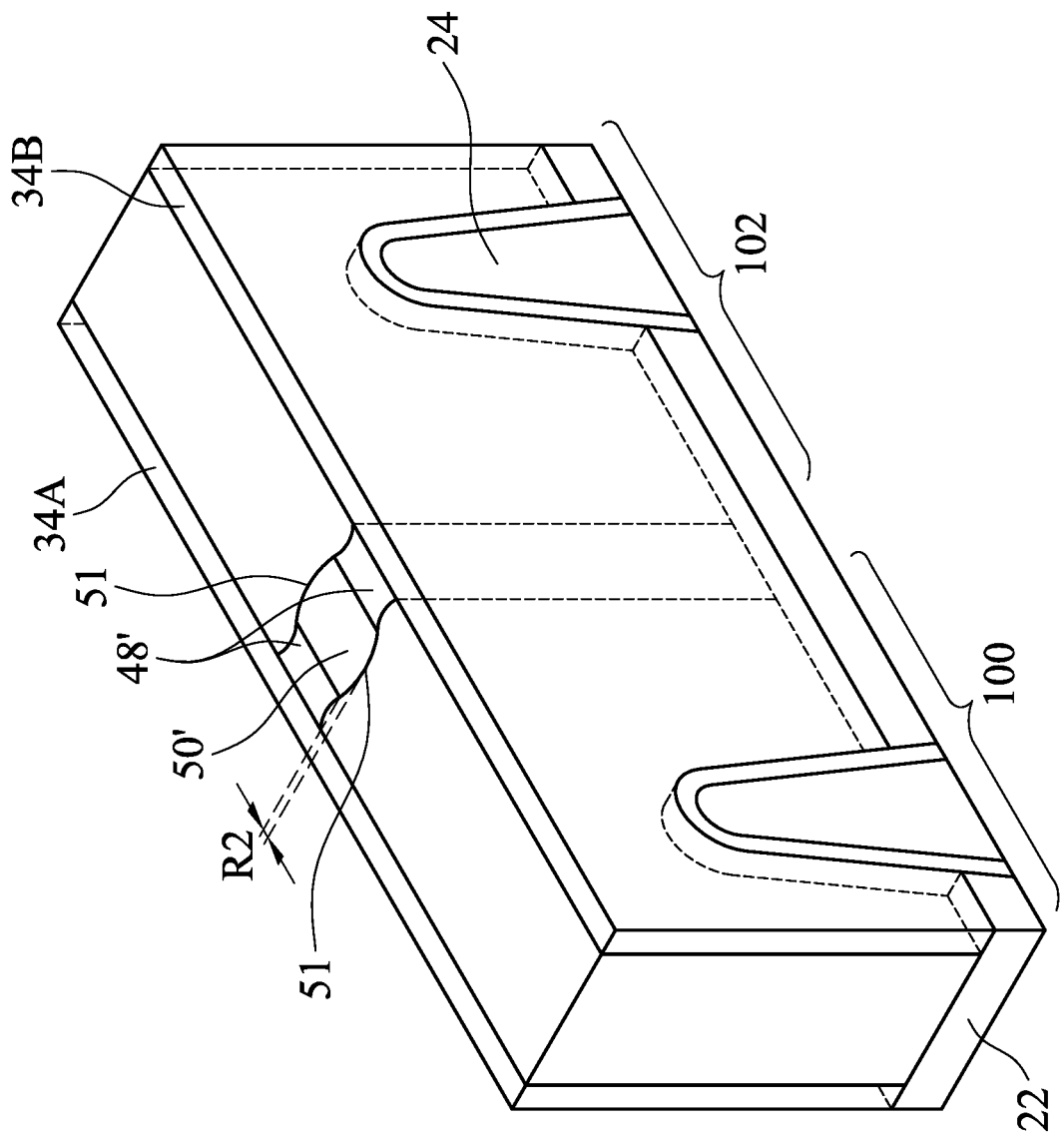
Figure 9B:
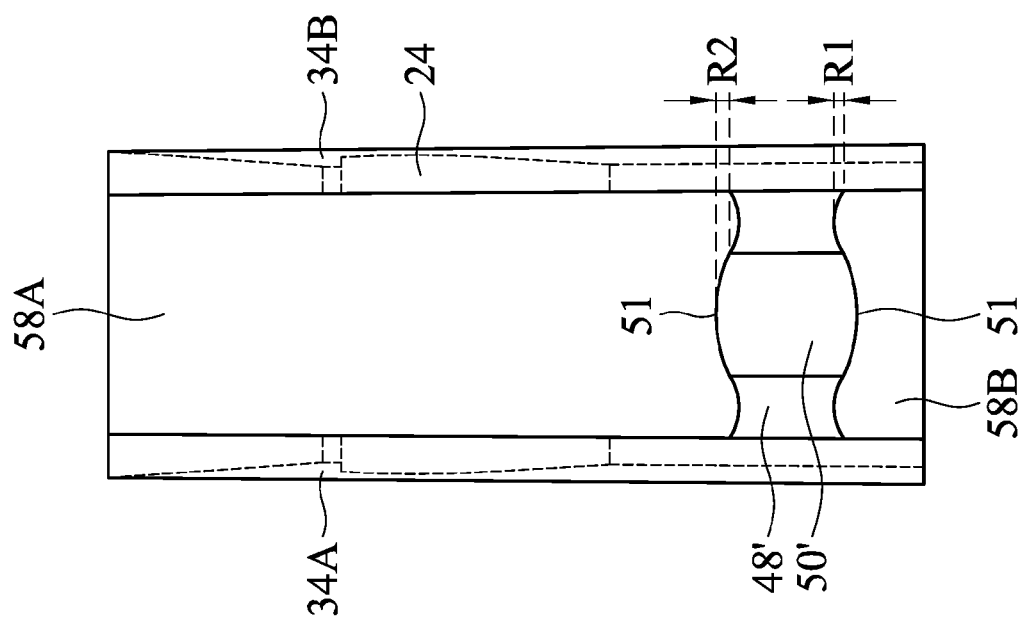

FIGS. 9A and 9B illustrate a perspective view and a top view, respectively, of FinFETs 100 and 102 in accordance with some embodiments. In accordance with these embodiments, dielectric region 50' also has curved sidewalls 51, which are caused by the thinning of gate isolation plug 52. Curved sidewalls 51 have center portions protruding more toward replacement gate 58A/58B, and the protruding distance R2 (FIG. 9B) may be greater than about 5 Å. Protruding distance R2 may also be in the range between about 5 Å and about 5 nm.

Figure 10A:
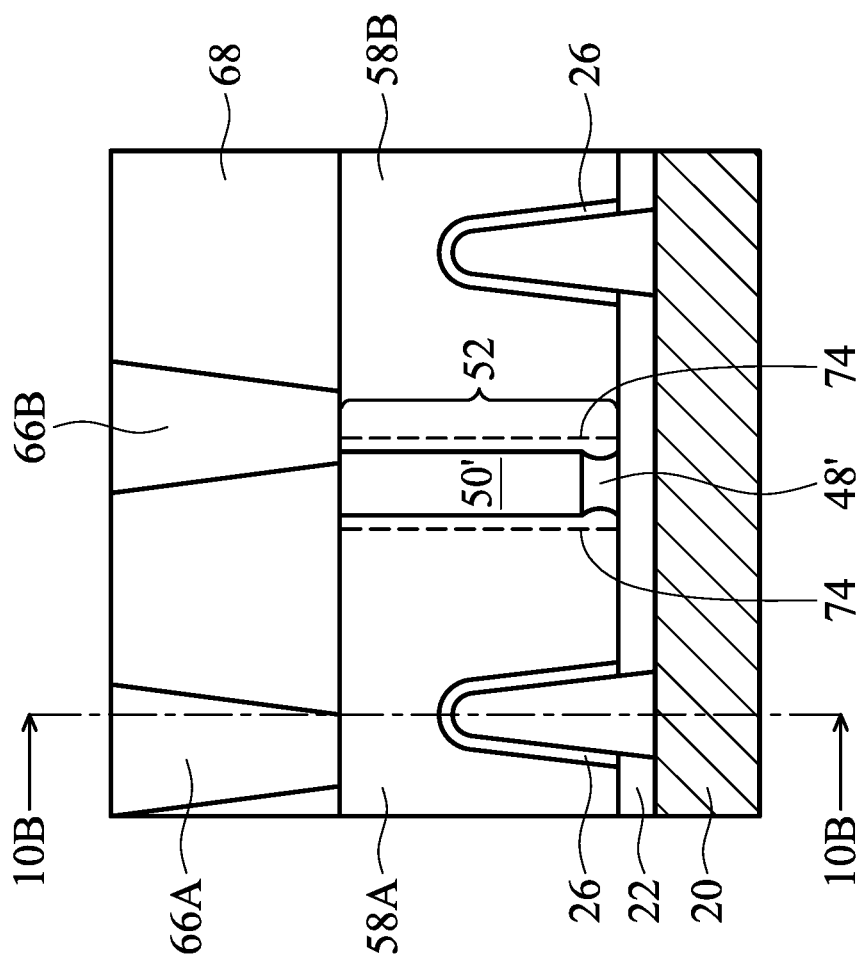
Figure 10B:
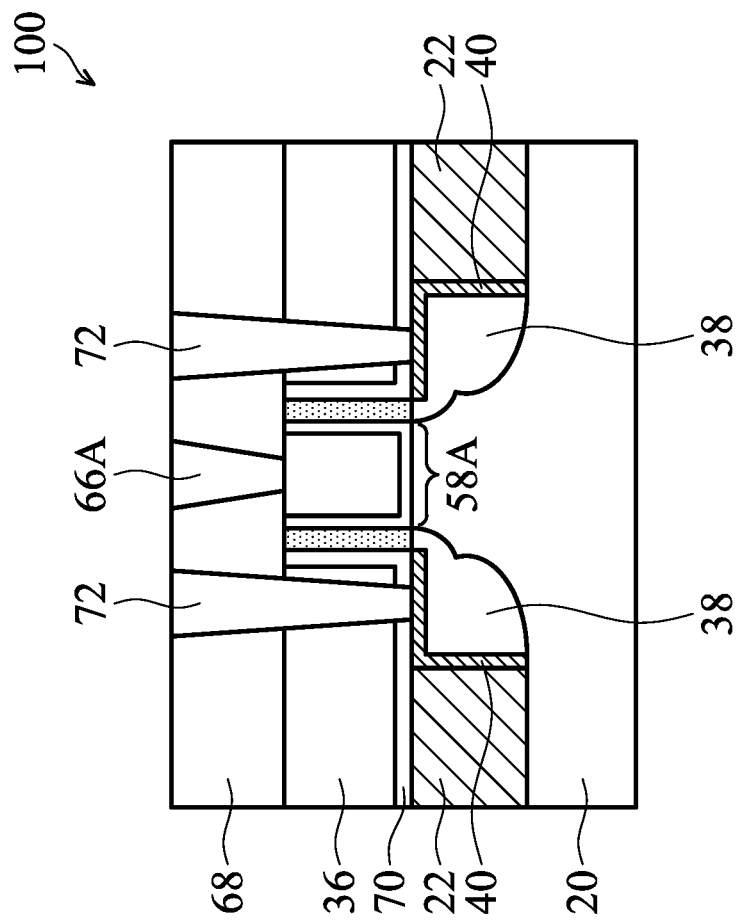

FIG. 10A illustrates the cross-sectional view in the formation of ILD 68 and gate contact plugs 66A and 66B in ILD 68. The respective step is illustrated as step 216 in the process flow shown in FIG. 12. ILD 68 may be formed of a material selected from the same candidate materials for forming ILD 36 (FIG. 1C). Contact plugs 66A and 66B are over, and are in contact with, gate stacks 58A and 58B, respectively. It is appreciated that although gate dielectrics 26 are shown, they may or may not exist in accordance with some embodiments.

FIG. 10B illustrates a cross-sectional view of transistor 100, wherein the cross-sectional view is obtained from the plane containing line 10B-10B in FIG. 10A. Source/drain contact plugs 72 are formed to extend into ILDs 36 and 68. Furthermore, contact etch stop layer 70 is also illustrated. It is appreciated that the lower portions of source/drain contact plugs 72 may be formed at this stage, or may be formed in the step shown in FIG. 1C, wherein the lower portions are illustrated as 42.

Figure 11:
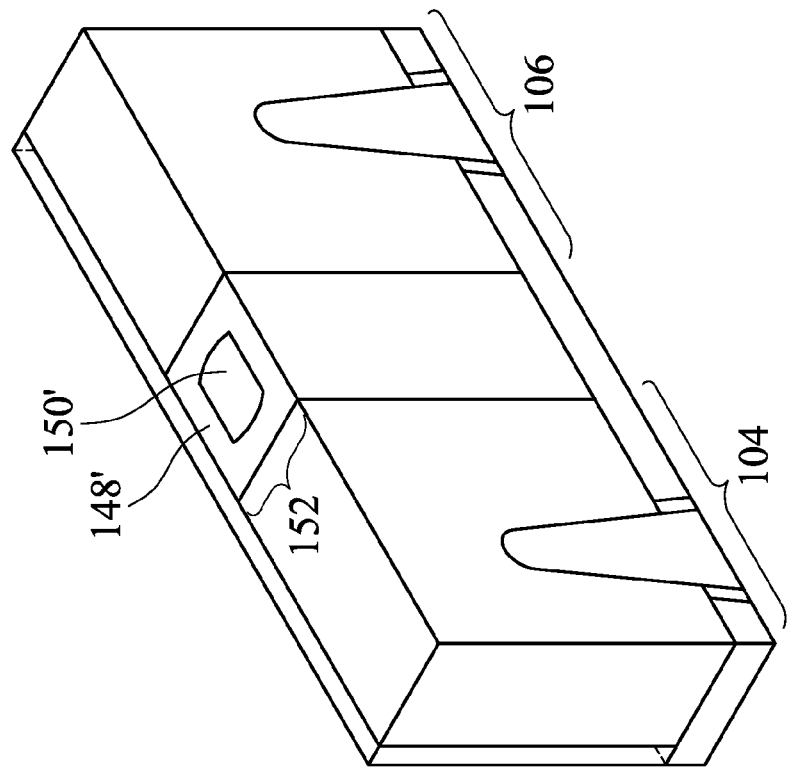
FIG. 11 illustrates two gate isolation plugs in different regions of a device die in accordance with some embodiments.
Figure 11:
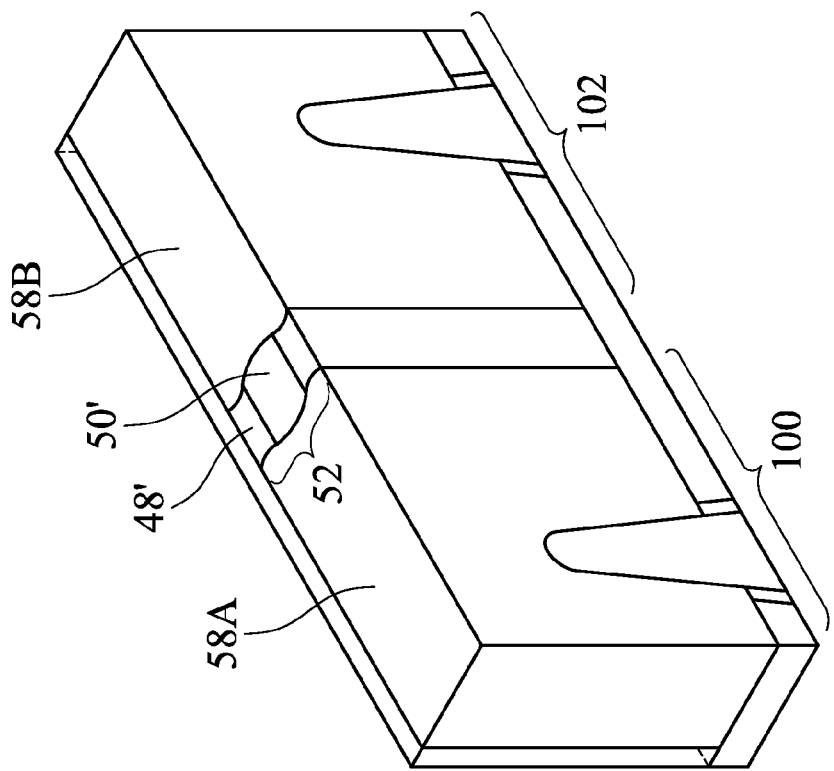

FIG. 11 illustrates transistors 100/102 having gate isolation plug 52 and transistors 104 and 106 having gate isolation plug 152. In accordance with some embodiments, transistors 100 and 102 are of a first device type formed in a first device region, while transistors 104 and 106 are of a second device type formed in a second device region different from the first device regions, wherein the first device type is different from the second device type. In accordance with some exemplary embodiments, transistors 100 and 102 are core devices (in a core region), memory devices (in a memory region), or the like while transistors 104 and 106 are Input/output (IO) devices (in an IO region). Gate isolation plug 52 includes dielectric layer 48' having a U-shape, while gate isolation plug 152 includes dielectric layer 148' having a shape of a basin, and dielectric region 150'. In accordance with some embodiments, transistors 100 and 102 need to be as small as possible, and hence gate isolation plug 52 also needs to be as small as possible. Accordingly, gate isolation plug 52 is thinned to have the U-Shape. Gate isolation plug 152, on the other hand, needs to have a width great enough to sustain high voltages applied on the gates of transistors 104 and 106. Accordingly, gate isolation plug 152 is not thinned. In accordance with some embodiments, the corresponding portions of gate isolation plugs 52 and 152 share some process steps. For example, layers 48' and 148' may share a same deposition process, and regions 50' and 150' may share a same deposition process and the same CMP step. Gate isolation plugs 52 and 152 are thus formed simultaneously, except gate isolation plug 52 is thinned, while no thinning is performed on gate isolation plug 152.

It is appreciated that although FinFETs 100, 102, 104, and 106 are used as an example, the concept of the present disclosure can also be used on planar transistors. The structure and the formation methods of the planar transistors and the corresponding gate isolation plugs are similar to what are shown in FIGS. 1A through 11, except that planar active regions rather than semiconductor fins 24 are used.

The embodiments of the present disclosure have some advantageous features. Referring to FIG. 10A, if gate isolation plug 52 is not thinned, the edges of gate isolation plug 52 may be at the positions illustrated by dashed lines 74, and gate contact plug 66B will have partial landing on replacement gate 58A. By making gate isolation plug 52 to be thinner, gate stack 58A is longer, and the partial landing will at least be reduced, or substantially eliminated.

In accordance with some embodiments of the present disclosure, a device includes a gate isolation plug, which further includes a U-shaped layer having a bottom portion and two sidewall portions, and an inner region overlapping the bottom portion. The inner region contacts the two sidewall portions. A first transistor has a first gate stack, and a first end of the first gate stack is in contact with both the inner region and the U-shaped layer of the gate isolation plug. A second transistor has a second gate stack, and a second end of the second gate stack is in contact with both the inner region and the U-shaped layer of the gate isolation plug. The first gate stack and the second gate stack are on opposite sides of the gate isolation plug.

In accordance with some embodiments of the present disclosure, a device includes an elongated gate stack, and a gate isolation plug dividing the elongated gate stack into a first gate stack and a second gate stack. The gate isolation plug includes an outer layer having a bottom portion and two sidewall portions, and an inner region overlapping and contacting the bottom portion. The top surfaces of the two sidewall portions of the outer layer and the top surface of the inner region are substantially coplanar with each other. The first gate stack and the second gate stack are in contact with opposite sidewalls of the inner region. A first FinFET has a first semiconductor fin, wherein the first gate stack crosses over the first semiconductor fin. A second FinFET has a second semiconductor fin, wherein the second gate stack crosses over the second semiconductor fin.

In accordance with some embodiments of the present disclosure, a method includes forming an elongated dummy gate stack, and etching the elongated dummy gate stack to form a first opening. The first opening separates the elongated dummy gate stack into a first dummy gate stack and a second dummy gate stack. A dielectric layer is deposited, and extends into the first opening. A dielectric region fills a remaining space of the first opening. The method further includes performing a planarization on the dielectric layer, the dielectric region, the first dummy gate stack, and the second dummy gate stack, removing the first dummy gate stack and the second dummy gate stack to form a second opening and a third opening, respectively, etching portions of the dielectric layer facing the second opening and the third opening until sidewalls of the dielectric region are exposed to the second opening and the third opening, and filling the second opening and the third opening with a first replacement gate and a second replacement gate, respectively.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a gate isolation plug comprising:
      a U-shaped layer comprising a bottom portion and two sidewall portions; and
      an inner region overlapping the bottom portion, wherein the inner region contacts the two sidewall portions;
   a first transistor comprising a first gate stack, wherein a first end of the first gate stack is in contact with both the inner region and the U-shaped layer of the gate isolation plug;
   a second transistor comprising a second gate stack, with the first gate stack and the second gate stack being on opposite sides of the gate isolation plug, wherein a second end of the second gate stack is in contact with both the inner region and the U-shaped layer of the gate isolation plug;
   a gate dielectric in contact with the gate isolation plug; and
   a gate electrode spaced apart from the gate isolation plug by the gate dielectric.

2. The device of claim 1, wherein the first gate stack has a first length and a first width smaller than the first length, and the second gate stack has a second length and a second width smaller than the second length, and the first width is equal to the second width, wherein lengthwise directions of the first gate stack and the second gate stack are aligned to a same straight line.

3. The device of claim 1 further comprising:
   a first gate spacer portion contacting the first gate stack, the U-shape layer, and the second gate stack.

4. The device of claim 3 further comprising a second gate spacer portion contacting the first gate stack, the U-shape layer, and the second gate stack, wherein both the first gate spacer portion and the second gate spacer portion are straight, and are parallel to each other.

5. The device of claim 1, wherein the bottom portion of the U-shaped layer has a curved sidewall in a cross-sectional view of the gate isolation plug, with the curved sidewall having a top portion, a bottom portion, and a middle portion recessed more than the top portion and the bottom portion.

6. The device of claim 1 further comprising a Shallow Trench Isolation (STI) region directly underlying, and in contact with, the gate isolation plug.

7. The device of claim 1, wherein the first transistor is a first Fin Field-Effect Transistor (FinFET) comprising a first semiconductor fin, and the second transistor is a second FinFET comprising a second semiconductor fin, and the first gate stack and the second gate stack cross over the first semiconductor fin and the second semiconductor fin, respectively.

8. The device of claim 1, wherein the U-shaped layer and the inner region of the gate isolation plug are formed of different dielectric materials.

9. The device of claim 1, wherein at least one of the inner region and the U-shaped layer has a curved edge in a top view of the gate isolation plug.

10. A device comprising:
an elongated gate stack;
a gate isolation plug dividing the elongated gate stack into a first gate stack and a second gate stack, wherein the gate isolation plug comprises:
an outer layer comprising a bottom portion and two sidewall portions; and
an inner region overlapping and contacting the bottom portion, wherein top surfaces of the two sidewall portions of the outer layer and a top surface of the inner region are substantially coplanar with each other, and the first gate stack and the second gate stack are in contact with opposite sidewalls of the inner region;
a first Fin Field-Effect Transistor (FinFET) comprising:
a first semiconductor fin, wherein the first gate stack crosses over the first semiconductor fin;
a second FinFET comprising:
a second semiconductor fin, wherein the second gate stack crosses over the second semiconductor fin; and
a gate spacer forming a full ring encircling a combined region comprising the first gate stack, the second gate stack, and the gate isolation plug.

11. The device of claim 10, wherein the bottom portion and the two sidewall portions of the gate isolation plug have substantially a same thickness.

12. The device of claim 10, wherein both the first gate stack and the second gate stack are in contact with opposite sidewalls of the bottom portion of the outer layer of the gate isolation plug.

13. The device of claim 12, wherein both the first gate stack and the second gate stack are in contact with opposite sidewalls of the two sidewall portions of the gate isolation plug.

14. The device of claim 10, wherein the top surfaces of the two sidewall portions of the outer layer and the top surface of the inner region are substantially coplanar with top surfaces of the first gate stack and the second gate stack.

15. A device comprising:
a gate isolation plug comprising:
a first region formed of a first dielectric material; and
a second region formed of a second dielectric material different from the first dielectric material, wherein the second region comprises a first portion and a second portion on opposite sides of the first region, and a bottom portion connected to bottom ends of the first portion and the second portion, wherein the bottom portion of the second region has a curved sidewall in a cross-sectional view of the gate isolation plug, with the curved sidewall having a top portion, a bottom portion, and a middle portion recessed more than the top portion and the bottom portion;
a first gate stack, wherein a first end of the first gate stack is in contact with both the first region and the second region of the gate isolation plug;
a second gate stack, wherein the first gate stack and the second gate stack are on opposite sides of the gate isolation plug, and wherein a second end of the second gate stack is in contact with both the first region and the second region;
a first gate spacer in contact with the first portion of the second region, the first gate stack, and the second gate stack; and
a second gate spacer in contact with the second portion of the second region, the first gate stack, and the second gate stack.

16. The device of claim 15 further comprising an inter-layer dielectric, wherein the inter-layer dielectric comprises a bottom surface in contact with each of the gate isolation plug, the first gate stack, and the second gate stack.

17. The device of claim 15, wherein both the first gate spacer and the second gate spacer are straight, and are parallel to each other.

18. The device of claim 15, wherein the first gate stack comprises:
a gate dielectric in physical contact with the gate isolation plug; and
a gate electrode spaced apart from the gate isolation plug by the gate dielectric.

19. The device of claim 15, wherein the second region of the gate isolation plug further comprises a third portion underlying the first region, wherein the third portion comprises a first end and a second end connected to the first portion and the second portion, respectively, of the second region of the gate isolation plug.

20. The device of claim 15, wherein the first gate stack comprises:
a gate dielectric in physical contact with the gate isolation plug; and
a gate electrode in physical contact with the gate isolation plug.

* * * * *